United States Patent
Matsuyama et al.

(10) Patent No.: US 6,312,171 B1
(45) Date of Patent: Nov. 6, 2001

(54) DEVELOPING APPARATUS AND METHOD THEREOF

(75) Inventors: Yuji Matsuyama; Masahito Hamada, both of Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/635,196

(22) Filed: Aug. 9, 2000

(30) Foreign Application Priority Data

Aug. 12, 1999 (JP) .................................................. 11-228671

(51) Int. Cl.[7] ................................ G03D 5/00; G03D 7/00
(52) U.S. Cl. ............................................. 396/579; 396/611
(58) Field of Search .................................... 396/604, 611, 396/627, 579; 118/52, 54, 56, 319, 320, 500, 666–668, 715; 427/240; 29/25.01; 134/902

(56) References Cited

U.S. PATENT DOCUMENTS

| | | | |
|---|---|---|---|
| 5,143,552 | 9/1992 | Moriyama | 118/666 |
| 5,625,433 | 4/1997 | Inada et al. | 396/604 |
| 5,928,390 | 7/1999 | Yaegashi et al. | 29/25.01 |

FOREIGN PATENT DOCUMENTS 06-163393-A * 5/1994 (JP) .
07-269932-A * 10/1995 (JP) .

* cited by examiner

*Primary Examiner*—D. Rutledge
(74) *Attorney, Agent, or Firm*—Rader, Fishman & Grauer, PLLC

(57) ABSTRACT

A current member is disposed above a wafer holding section for holding a wafer and a top plate and a bottom plate of the current member are positioned so that respective air holes are overlapped each other in a vertical direction, and a developing solution is heaped on a front face of the wafer. Thereafter, the developing is performed with the bottom plate of the current member slid in a lateral direction so that the air holes are not overlapped each other in the vertical direction. In this configuration, air streams to the wafer are obstructed during the developing because the air holes in the current member are obstructed in the vertical direction, whereby occurrence of temperature distribution of the developing solution within the plane of the wafer caused by flows of air currents to the wafer is prevented and uniform developing processing can be performed.

15 Claims, 16 Drawing Sheets

PRIOR ART

DEVELOPING APPARATUS AND METHOD THEREOF

CROSS-REFERENCE TO RELATED APPLICATIONS

This application is based upon and claims the benefit of priority from the prior Japanese Patent Application No. 11-228671, filed Aug. 12, 1999, the entire contents of which are incorporated herein by reference.

BACKGROUND OF THE INVENTION

The present invention relates to a substrate processing apparatus for performing substrate processing such as developing processing and the like, for example, for a substrate and a method thereof.

A mask for forming a predetermined pattern on a front face of a semiconductor wafer (hereinafter, referred to as "wafer") or a glass substrate (LCD substrate) of a liquid crystal display is obtained by applying a resist to a front face of a substrate such as a wafer or the like and then irradiating rays of light, electron rays, ion beams, or the like to the resist surface, and performing developing. The developing processing here is performed by dissolving portions irradiated with light or the like or portions without such irradiation in an exposure process with use of an alkaline water solution or the like, and conventionally it has been performed by a method shown in FIG. 18.

In the conventional method, a substrate, for example, a wafer W is suction-held, for example, on a spin chuck 11 having a vacuum suction function, and a supply nozzle 13 in which many discharge holes 12 are arranged along a length corresponding to a diameter of the wafer W is positioned so that the discharge holes 12 are placed above the wafer surface by 1 mm at the central portion of the wafer W. Then, a developing solution 10 is supplied to the center of the wafer surface from the discharge holes 12 to thereby perform solution heaping as shown in FIG. 18. Subsequently, the wafer W is made to half-rotation (180-degree rotation) while the developing solution 10 is supplied from the discharge holes 12.

Thus, the developing solution which has been first heaped at the central portion of the wafer is spread out and simultaneously the developing solution 10 is newly supplied, resulting in formation of a solution film of the developing solution 10 with a predetermined thickness over the entire wafer surface. After the heaping of the developing solution 10 is performed, the wafer W is left standing, for example, for 60 seconds, and then a rinse solution is supplied onto the wafer surface to rinse away the developing solution, whereby the developing is performed.

Explaining briefly a conventional developing apparatus in which the above-described developing processing is performed with reference to FIG. 19, the spin chuck 11 is surrounded by a cup 14 for preventing the developing solution 10 from splashing out. A filter unit 15 formed by combination of a filter and a fan is provided above the cup 14 and a current plate 16 in which many air holes 16a are formed is provided between the filter unit 15 and the cup 14.

An exhaust passage 17 is connected to the cup 14, and part of air which has been exhausted by the exhaust passage 17 is circulated to be supplied to the filter unit 15 via a filter apparatus not shown for eliminating impurities and performing adjustment to a predetermined temperature and humidity to be supplied from the filter unit 15 toward the cup 14 while forming downflow. The air from the filter unit 15 from which impurities have been eliminated and which has been adjusted to the predetermined temperature and humidity passes through the current plate 16, thereby being supplied to the cup 14 side with being increased in uniformity. The downflow of air, which is adjusted with high accuracy, is formed to make developing solution temperatures and evaporation speeds uniform.

However, for example, in the case of using an ion beam resist, developing unevenness occurs in the above-described developing method, whereby developed line width varies depending on the position, which causes a disadvantage of, for example, an irregularity in line width of about 4 nm between an area close to the center of the wafer and a rim portion thereof. From a study of a cause of the above, it is conceivable that temperature distribution occurs in the developing solution 10 within the plane of the wafer because degrees of proceeding of the developing depends on the temperature of the developing solution 10.

In other words, the developing solution 10 is adjusted to a temperature of, for example, about 23° C., but water contained in the developing solution 10 evaporates while the wafer W is subjected to the solution heaping and then left standing, whereby latent heat in the developing solution 10 is lost, and thus the temperature of the developing solution 10 falls with time. Meanwhile, it is conceivable that the temperature of the rim area falls to be lower than that of the area close to the center of the wafer W within the plane due to the formation of the downflow of the aforesaid air which has been adjusted with high accuracy. More specifically, by the formation of the downflow, air currents flow from above seeing from the wafer W. The air currents which have blown against the wafer W flow toward the outer periphery side thereof along the wafer face as shown in FIG. 20, whereby an airflow amount to the rim area becomes larger than that to the area close to the center. Therefore, it is presumed that heat of evaporation in the rim area is larger than that in the area close to the center within the plane of the wafer W, so that an amount of heat radiation in the rim area becomes larger than that in the area close to the center, resulting in a high degree of fall in temperature of the rim area.

Therefore, it is presumed that temperature difference in the developing solution 10 of about 1° C. occurs between the area close to the center of the wafer and the rim portion at the start of a rinse, whereby there occurs unevenness in the developing state, resulting in occurrence of a bad influence of variations in finished measurements.

BRIEF SUMMARY OF THE INVENTION

An object of the present invention is to provide a developing apparatus for enhancing uniformity of processing by making temperatures in a developing solution uniform within a plane of a substrate during developing to thereby prevent occurrence of developing unevenness because of temperature difference in the developing solution and a method thereof.

To solve the aforesaid disadvantages, a developing apparatus of the present invention is a developing apparatus for heaping a developing solution to a front face of a substrate to perform developing in an atmosphere in which an air stream toward the front face of the substrate is formed, comprising: a substrate holding section for holding the substrate; a supply section for supplying the developing solution to the substrate; a first current plate provided on the front face side of the substrate held by the substrate holding section to oppose the substrate and in which first air holes are formed; and a second current plate provided to oppose the first current plate to move in a plane direction relative to the first current plate and in which second air holes are formed, wherein the first current plate and the second current plate are moved relative to each other in the plane direction to overlap the first air holes and an area of the second current plate where the second air holes are not formed in a direction orthogonal to the plane direction to thereby adjust sizes of the first air holes and control an airflow amount of an air current blowing against the front face of the substrate.

In such a developing apparatus, the airflow amount of air an current blowing against the front face of the substrate can be adjusted, whereby heat of evaporation of the developing solution on the substrate which changes in accordance with the amount of airflow to the front of the substrate can be adjusted, with the result that the temperature of the developing solution on the substrate can be controlled.

Concretely, making the sizes of the first air holes smaller while the developing of the front face of the substrate is performed with the developing solution remaining heaped on the substrate than while the developing solution is heaped on the front face of the substrate to make an airflow amount of an air current blowing against the front face of the substrate smaller during the developing than during the heaping of the developing solution, is performed. This case includes preventing an air current from blowing against the front face of the substrate during the developing. In other words, in this developing apparatus, a method comprising the step of: heaping a developing solution to the front face of the substrate in an atmosphere in which an air stream toward the front face of the substrate is formed; and developing the front face of the substrate with the developing solution remaining heaped on the substrate while an air current is prevented from blowing against the front face of the substrate, is carried out.

If the air current is prevented from blowing against the front face of the substrate during the developing as above, a change in heat of evaporation of the developing solution on the substrate due to an influence of the air current is suppressed, whereby amounts of heat radiation of the developing solution becomes almost uniform within the plane of the substrate. Therefore, temperature variations in the processing solution on the substrate are made almost uniform within the plane of the substrate and occurrence of developing unevenness because of temperature difference in the processing solution is suppressed, so that the uniformity of processing can be enhanced.

Further, in the present invention, it is also suitable to develop the front face of the substrate while an area of the front face of the substrate against which an air current blows is adjusted. For example, sizes of the first air holes may be made larger in an area close to the center of the substrate than in a rim area to make an airflow amount of an air current blowing against the area close to the center of the front face of the substrate larger than that against the rim area while the developing of the front face of the substrate is performed. Here, the case where an air current blows against only the area close to the center and not against the rim area is included.

Also in this case, air currents which have blown against the substrate flow toward the rim area along the front face of the substrate, and thus when air currents uniformly blow against the entire face of the substrate, the airflow amount is larger in the rim area. Accordingly, the airflow amount of air currents blowing against the area close to the center of the front face of the substrate is made larger than that against the rim area, and as a result, the airflow amounts of air currents blowing against the substrate become almost uniform within the plane of the substrate. Therefore, temperature variations of the developing solution on the substrate are made almost uniform within the plane of the substrate, so that the uniformity of developing processing can be enhanced.

These objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
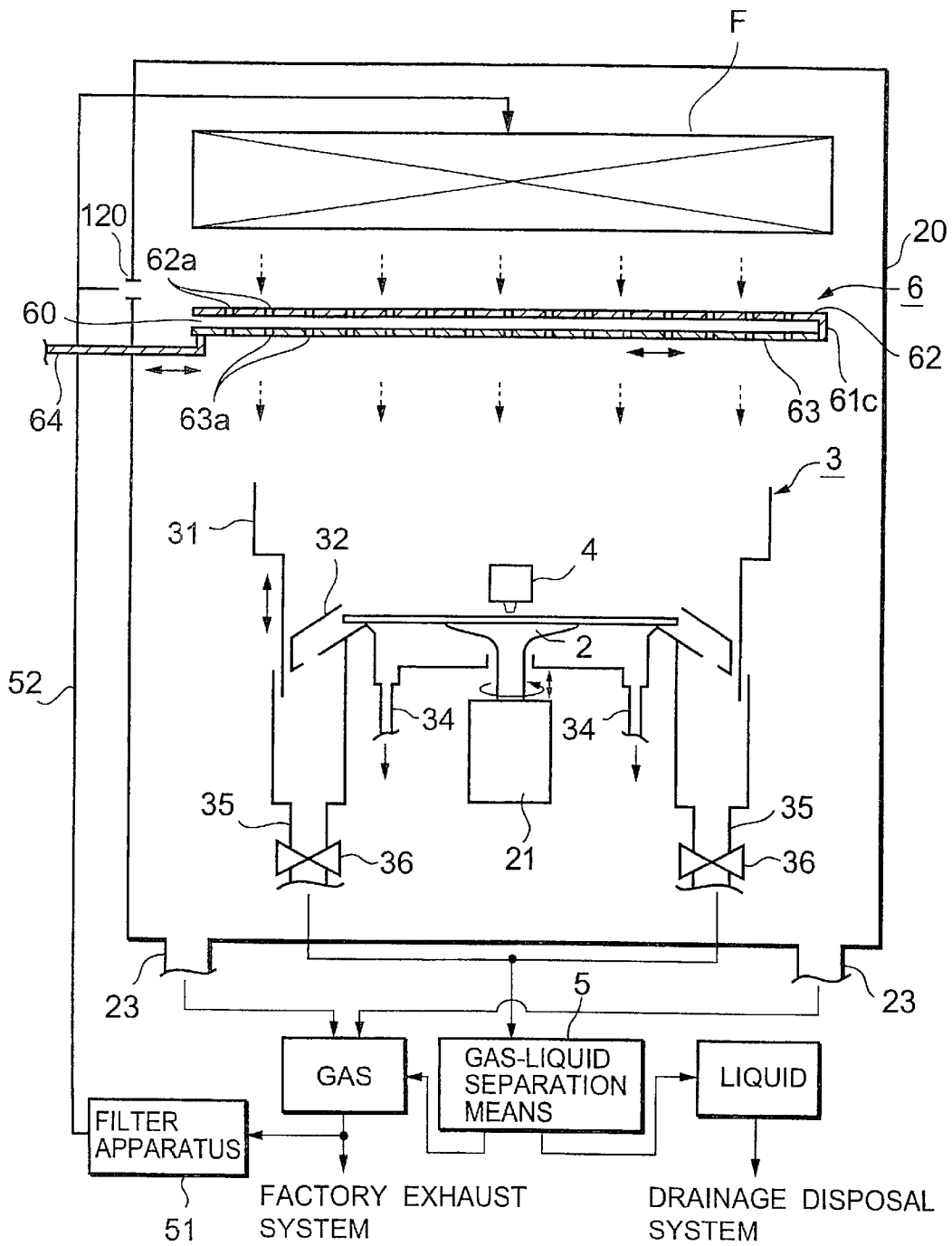
FIG. 1 is a sectional view showing the entire structure of an example of a developing apparatus according to an embodiment of the present invention.

FIG. 1 is a vertical sectional view showing the entire structure of a developing apparatus to which the present invention is applied and numeral 20 in FIG. 1 is a processing case for housing the developing apparatus therein. A wafer holding section 2 composing a substrate holding section for holding an area close to the center of a wafer W, which is a substrate, in an almost horizontal state so that a face to be processed (front face) of the wafer W facing upward, rotating the wafer W around a vertical axis, and raising and lowering the wafer W is provided in the processing case 20.

Figure 2:
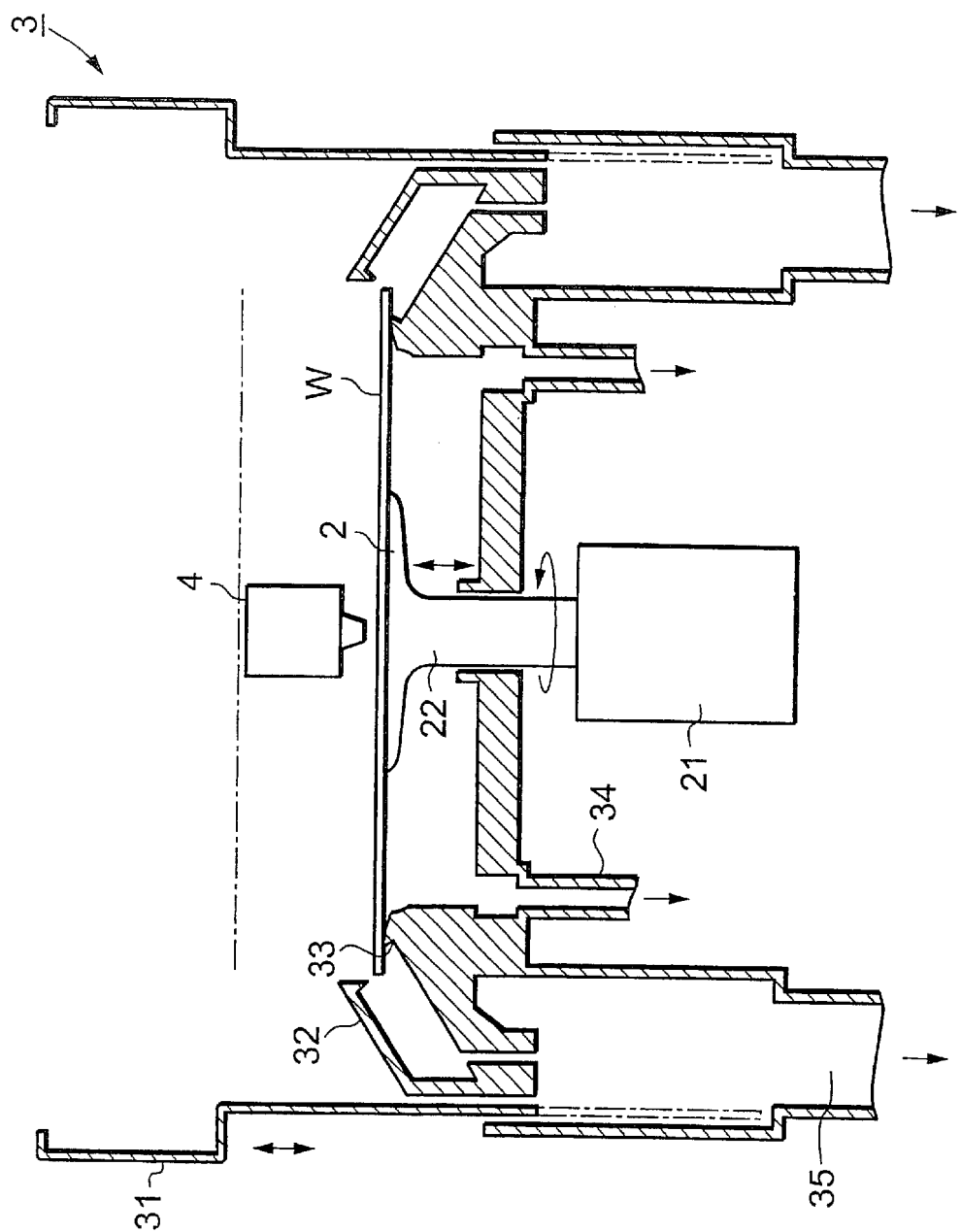
FIG. 2 is a sectional view showing a wafer holding section used in the aforesaid developing apparatus.

Explaining the wafer holding section 2 with reference to FIG. 2, the wafer holding section 2 has, for example, a vacuum suction function and is configured to be rotatable around the vertical axis and ascendable and descendable by means of a drive section 21 in which a raising and lowering mechanism and a motor are combined through a rotation shaft 22. Thus, the wafer W is held by the wafer holding section 2 to be ascendable and descendable and rotatable between a processing position where the wafer W is suction-held by the wafer holding section 2 shown in FIG. 2 and a delivery position for the wafer W, shown by a one-dotted chain line in FIG. 2, above the processing position.

Around the above-described wafer holding section 2, provided is a cylindrical cup 3 for enclosing the periphery of the wafer W at the processing position to prevent a developing solution supplied onto the wafer from splashing thereabout when the developing solution is shaken off. The cup 3 comprises an outer cup 31 and an inner cup 32. The outer cup 31 is configured to be ascendable and descendable by a raising and lowering mechanism not shown so that an upper end of the outer cup 31 is positioned above the delivery position for the wafer W while preventing the developing solution from splashing thereabout and the upper end is positioned below the delivery position for the wafer W during the delivery of the wafer W and heaping of the developing solution.

Figure 3A:
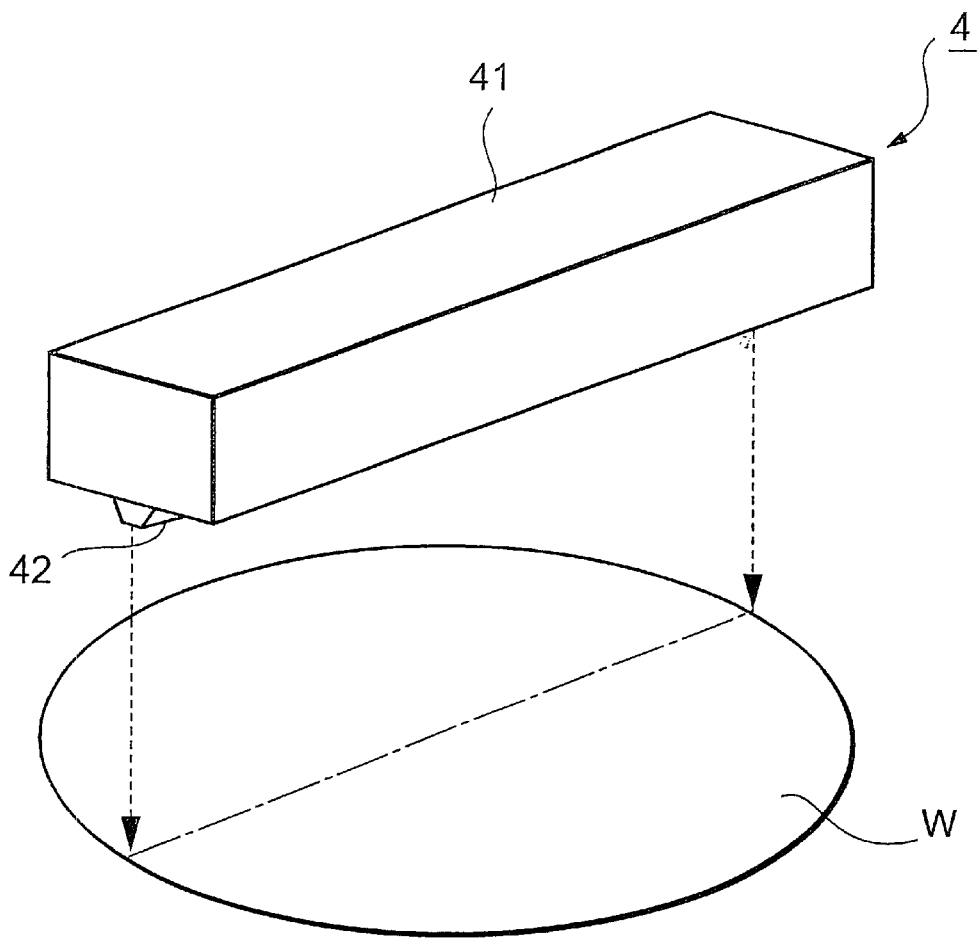
FIGS. 3A and 3B are a perspective view and a bottom view showing a nozzle used in the aforesaid developing apparatus.
Figure 3B:
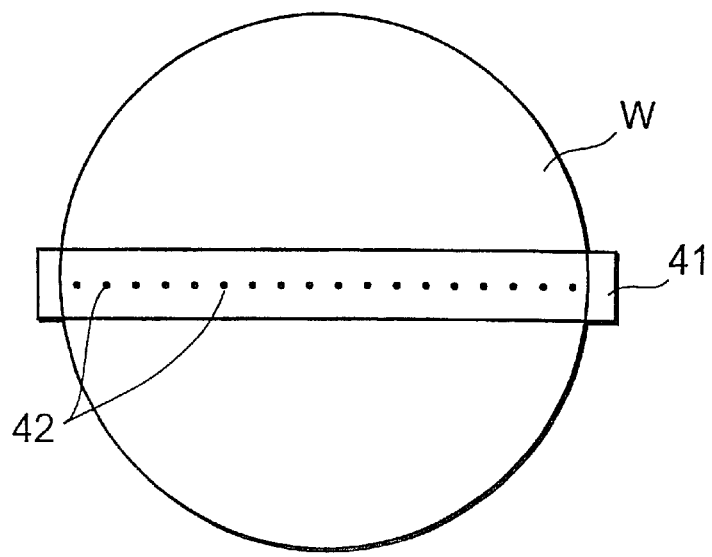

The inner cup 32 is provided inside the outer cup 31 and below the delivery position for the wafer W so that an upper end of the inner cup 32 is positioned above the wafer W while the wafer W is at the processing position. This inner cup 32 is inclined inward toward a top at the side of the wafer W, and an annular projecting portion 33 is provided below the wafer W in such a manner to contact or not to contact the rim on the rear face side of the wafer W placed at the processing position to prevent the developing solution from coming onto the rear face side of the wafer W, and thus the inner cup 32 is formed to be inclined upward toward the projecting portion 33 from the outside of the wafer W. Furthermore, a drainage passage 34 for a developing solution and an ejection passage 35 serving as an exhaust passage and a drainage passage are connected to the cup 3, and the ejection passage 35 is connected to gas-liquid separation means 5 described later provided outside the processing case 20 with an open/close valve 36 therebetween A nozzle 4 composing a supply section for suppling a developing solution onto the front face of the wafer W is provided above the wafer W placed at the processing position where the wafer W is suction-held by the wafer holding section 2. As shown in FIGS. 3A and 3B, this nozzle 4 includes a nozzle main body 41 which is formed, for example, in the shape of a horizontally elongated rod and supply holes 42, provided in the under face of the nozzle main body 41, for discharging the developing solution onto the front face of the wafer W along a radial direction thereof. The nozzle main body 41 and the supply holes 42 are configured to supply the developing solution to an area close to the center line (a line passing through the center of the wafer W and extending in the radial direction thereof) of the front face of the wafer.

Figure 4:
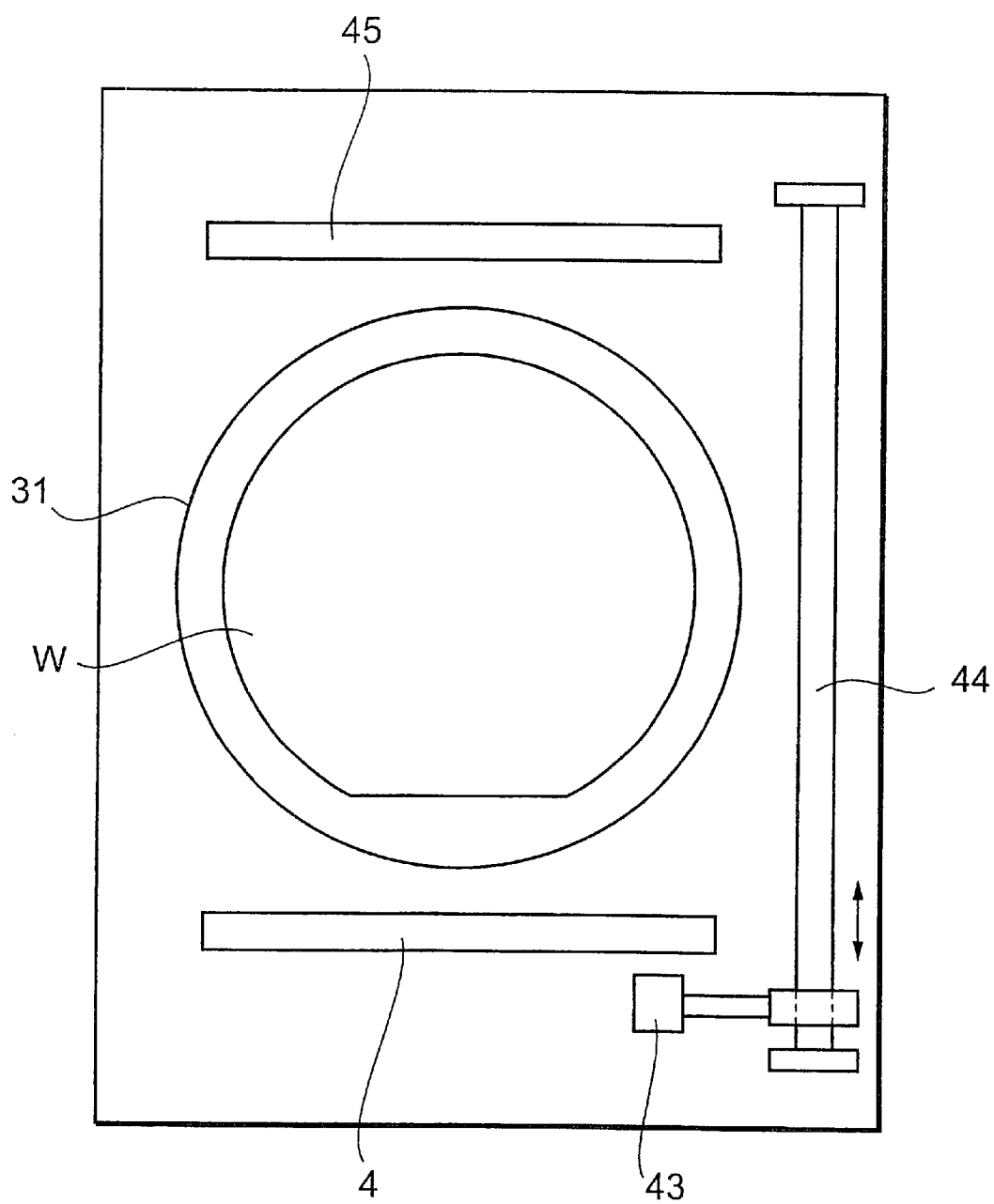
FIG. 4 is a plan view showing the aforesaid developing apparatus.

The nozzle 4 is configured to be held by a nozzle holding section 43 and horizontally movable along a guide rail 44 by way of example as shown in FIG. 4, and to be ascendable and descendable by a raising and lowering mechanism not shown. Thereby, the nozzle 4 can move between a stand-by position outside the wafer holding section 2 and an upper position above almost the center of the wafer holding section 2 so as not to interfere with the transfer of the wafer W. Further, the nozzle 4 is ascendable and descendable between the aforesaid upper position and a developing solution supply position that is a position directly below the upper position.

A developing solution storage tank (the illustration thereof is omitted) communicates with the above-described nozzle 4 via a supply pipe not shown. Moreover, the developing apparatus includes a rinse nozzle 45 for supplying a rinse solution to rinse away the developing solution onto the front face of the wafer W. This rinse nozzle 45 is structured in the same manner as the aforesaid nozzle 4 and held by the nozzle holding section 43 to be movable between a stand-by position outside the wafer holding section 2 and a supply position where the rinse solution is supplied onto the wafer.

Moreover, as shown in FIG. 1, a filter unit F formed by combination of a filter for cleaning air, a suction fan, and the like is provided above the cup 3 inside the processing case 20.

Meanwhile, provided below and outside the processing case 20 is the gas-liquid separation means 5 to which the other end side of the ejection passage 35 is connected. The gas-liquid separation means 5 has a gas-liquid separation function, for example, by inertial impaction. In the gas-liquid separation means 5, an atmosphere ejected from the processing case 20 is separated into a gas component and a liquid component, and the liquid component is ejected to a drainage disposal system and the gas component is ejected to a factory exhaust system, while part of the gas component is introduced into a filter apparatus 51. Further, an exhaust passage 23 is connected to the lower end side of the processing case 20. An atmosphere in the processing case 20 exhausted from the exhaust passage 23 is also ejected to the factory disposal system, while part of thereof is introduced into the filter apparatus 51.

The filter apparatus 51 includes an impurity elimination section for eliminating impurities by means of gas-liquid contact through spraying, for example, pure wafer that is an impurity eliminating solution, an adjustment section including, for example, a heating mechanism and a humidifying mechanism, for adjusting air from which impurities have been eliminated to a predetermined temperature and humidity and sending it out, and the like. The air which has been cleaned in the filter apparatus 51 is sent out to above the filter unit F through a delivery passage 52 to be jetted into the processing case 20 as downflow as shown by dotted lines in FIG. 1. Thereby, the inside of the processing case 20 is brought to an atmosphere in which air streams toward the front face of the wafer W placed at the processing position are formed. At this time, by adjusting an opening degree of an open/close valve 36 provided at the ejecting passage 35, an airflow amount in the processing case 20 is adjusted and, for example, the airflow amount is increased as the degree of opening of the open/close valve 36 is increased.

Figure 5A:
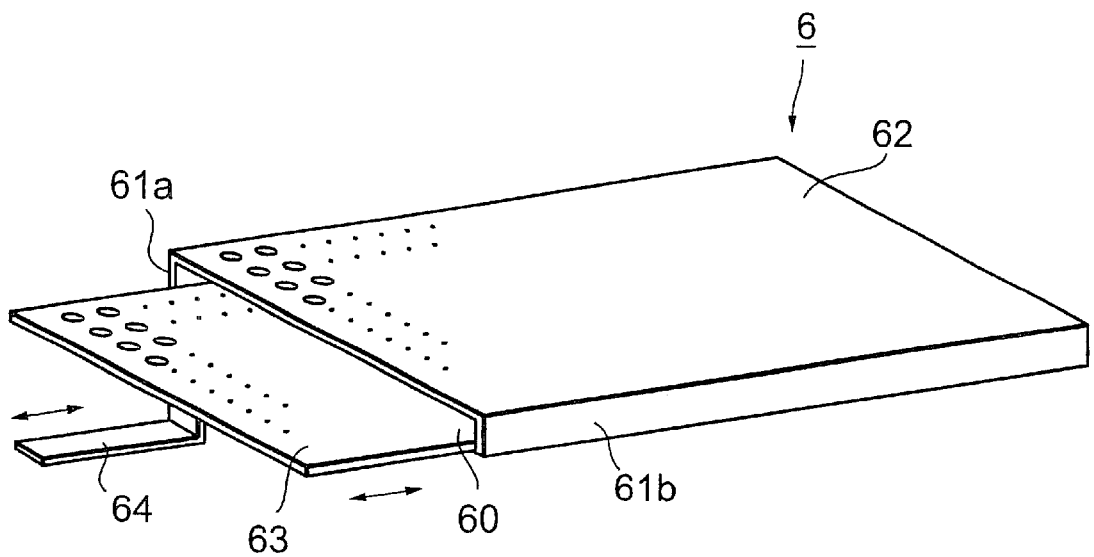
FIGS. 5A and 5B are a perspective view and a plan view showing a current member used in the aforesaid developing apparatus.

Between the filter unit F and the cup 3 in the processing case 20, provided is a current member 6 having a face oppose the cup 3 and which is larger than an opening portion of the cup 3 so as to face the wafer W placed at the processing position. The current member 6 is a flat hollow body with a square cross section and provided with an opening portion 60 formed at one side portion by way of example as shown in FIG. 5A. The current member 6 is formed with three side plates 61 (61a, 61b, and 61c), a top plate 62 forming a first current plate, and a bottom plate 63 forming a second current plate. The bottom plate 63 is configured to be movable to a first position opposing the top plate 62 and from the first position toward the opening portion 60 side in a horizontal direction (a plane direction) along rails not shown formed on the inside of the opposing two side plates 61a and 61b by means of a support member 64.

Figure 5B:
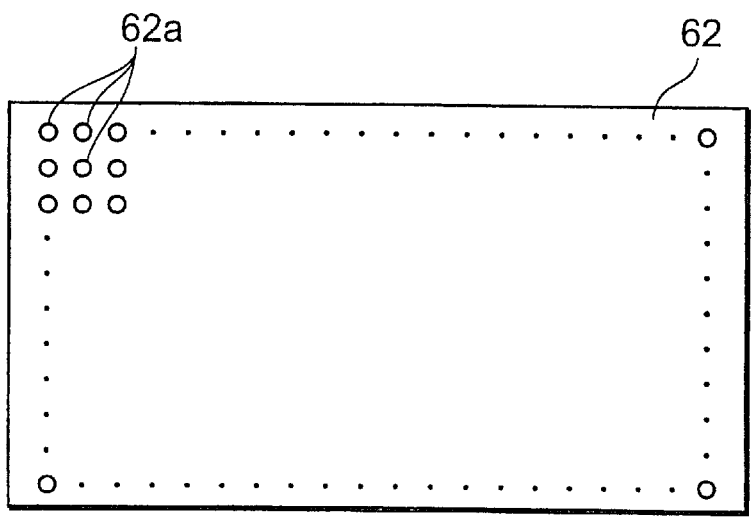
Figure 6A:
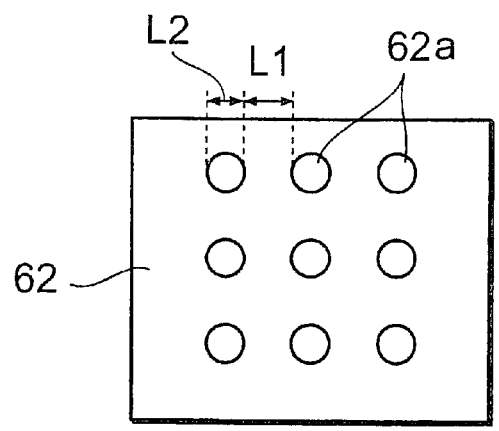
FIGS. 6A and 6B are a plan view and sectional view showing the current member used in the aforesaid developing apparatus with the bottom plate at a first position.

A clearance between the top plate 62 and the bottom plate 63 is formed to be, for example, about 5 mm, and first air holes 62a and second air holes 63a for allowing clean air from the filter unit F to pass therethrough are formed in the top plate 62 and the bottom plate 63 respectively as shown in FIG. 5B. The air holes 62a and 63a are formed in the top plate 62 and the bottom plate 63 in the same pattern. As parts of the top plate 62 and the bottom plate 63 are shown in FIGS. 6A and 6C, the pattern is set such that a distance L1 between air holes 62a (63a) adjacent to each other in a movement direction is larger than a maximum diameter L2 of the air holes 62a (63a) in the movement direction.

Figure 6B:
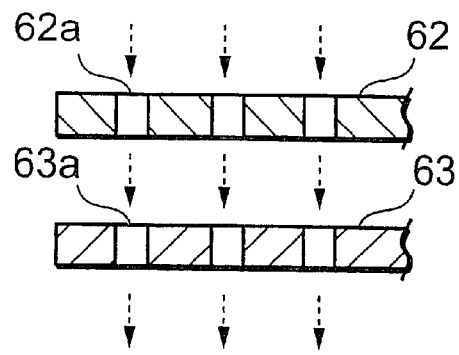
Figure 6C:
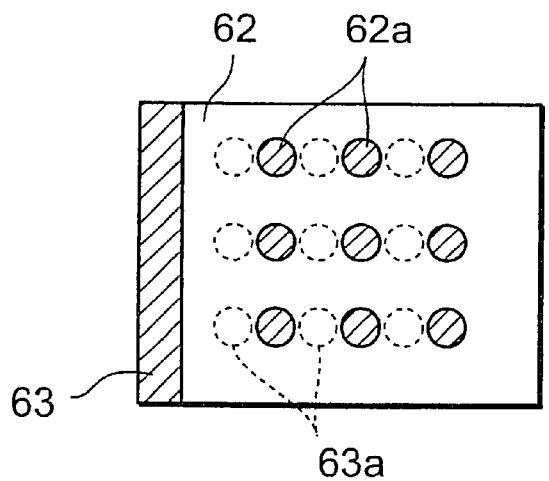
FIGS. 6C and 6D are a plan view and a sectional view showing the current member used in the aforesaid developing apparatus with the bottom plate at a second position.

Thereby, while the bottom plate 63 is at the aforesaid first position, the air holes 62a and 63a of the top plate 62 and the bottom plate 63 are overlapped each other in a vertical direction (a direction orthogonal to the plane direction) as shown in FIG. 6B. Thus, the air from the filter unit F passes downward through the overlapped air holes 62a (63a), with the result that the cleaned air flows toward the wafer W on the wafer holding section 2 with uniformity of flows being increased by passing through the air holes 62a (63a).

Figure 6D:
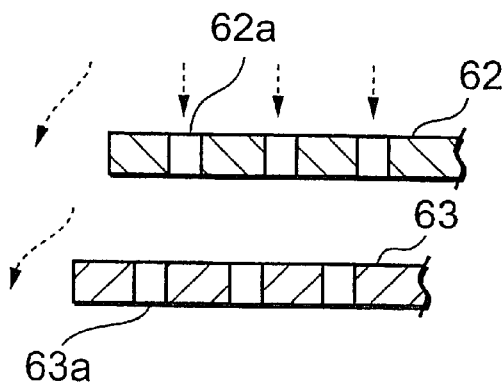

Meanwhile, while the bottom plate 63 is at a second position which is moved slightly, for example, by a distance which is larger than L2 and smaller than L1 toward the opening portion 60 side from the first position, as shown in FIG. 6D, the air holes 62a and 63a of the top plate 62 and the bottom plate 63 are not overlapped each other in the vertical direction, and thus the air holes 62a of the top plate 62 are obstructed at their outlet side by the bottom plate 63 thereunder. Accordingly, in this case, the air from the filter unit F can not pass through the bottom plate 63, with the result that air streams are obstructed by the current member 6 and passes downward at the side of the current member 6.

Figure 7A:
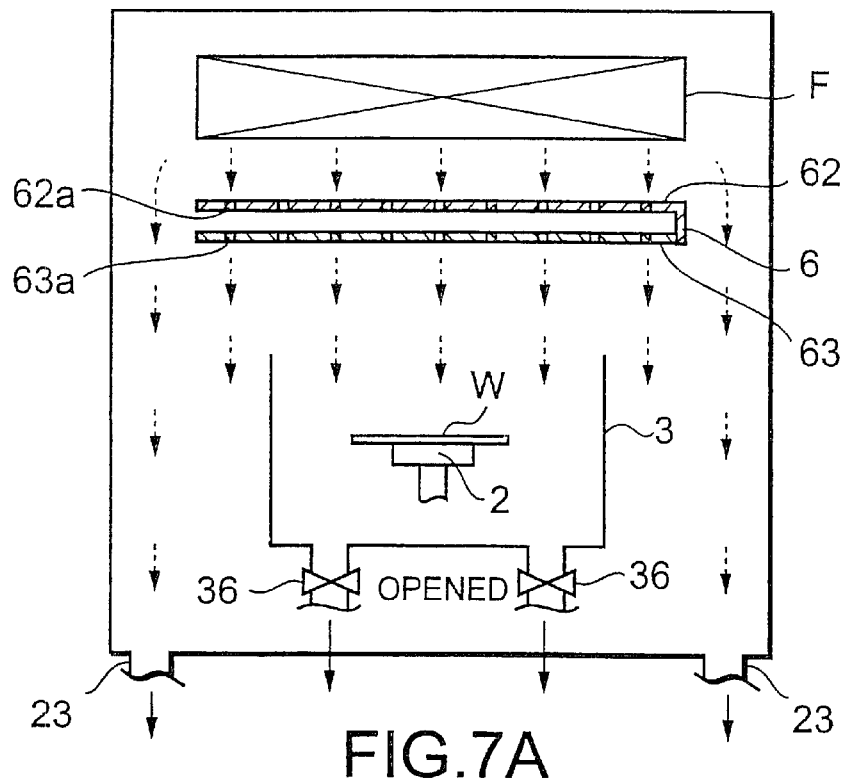
FIGS. 7A and 7B are sectional views showing operations of the aforesaid developing apparatus.

Subsequently, an embodiment of a method of the present invention carried out by the use of the aforesaid apparatus will be explained using FIGS. 7 and 8. Initially, as shown in FIG. 7A, the bottom plate 63 of the current member 6 is positioned at the first position and the open/close valve 36 is opened to thereby form downflow of clean air from which impurities have been eliminated and which has been adjusted at a predetermined temperature and humidity in the processing case 20 through the filter unit F and the air holes 62a and 63a of the current member and adjust the airflow amount to about 0.3 m/s. In this case, since the open/close valve 36 is opened, the atmosphere in the processing case 20 flows out of the ejection passage 35 and the exhaust passage 23, whereby air currents blow downward inside and outside the cup 3 in the processing case 20.

In this state, the wafer holding section 2 is raised to the aforesaid delivery position, and a transfer arm not shown delivers a wafer W on which a resist film has been formed and exposed onto the wafer holding section 2 to allow the wafer holding section 2 to vacuum-hold the wafer W. Since downflow is formed in the processing case 20 as described above, air currents blow from above to the front face of the wafer W held by the wafer holding section 2. Incidentally, for example, a mechanical chuck for mechanically pushing the rim of the wafer W may be used as a technique of pushing the wafer W to the wafer holding section 2.

Figure 8A:
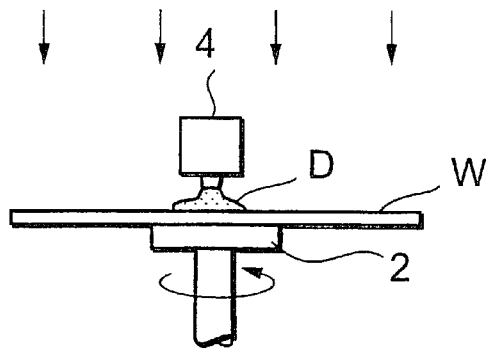
FIGS. 8A to 8D are sectional views showing operations of the aforesaid developing apparatus.

Subsequently, with downflow with an airflow mount of about 0.3 m/s being formed in the processing case 20, the nozzle 4 placed at the stand-by position is moved to the supply position through the upper position above the wafer holding section 2, the developing solution D is discharged from the nozzle 4 to thereby supply the developing solution D to the area close to the center line of the wafer W, and the wafer holding section 2 is rotated 180 degrees at a rotation speed of, for example, about 30 rpm, whereby heaping of the developing solution D is performed as shown in FIG. 8A. More specifically, at the processing position, tips of the supply holes 42 of the nozzle 4 contact the developing solution D that has been supplied onto the wafer surface from the nozzle 4. In that state, when the developing solution D is supplied from the supply holes 42 to the wafer surface while the wafer W is rotated 180 degrees, the developing solution D is applied on the entire face of the wafer W by diffusion of the developing solution D by centrifugal force of the rotation and spread of the developing solution D by the supply holes 42 of the nozzle 4, whereby the solution heaping is performed.

Figure 7B:
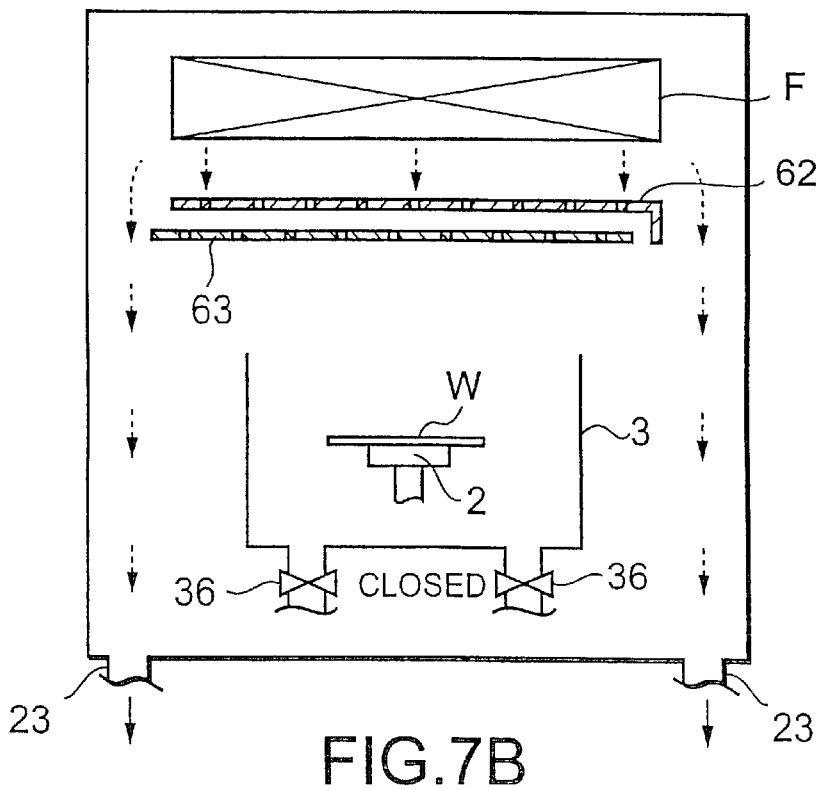
Figure 8B:
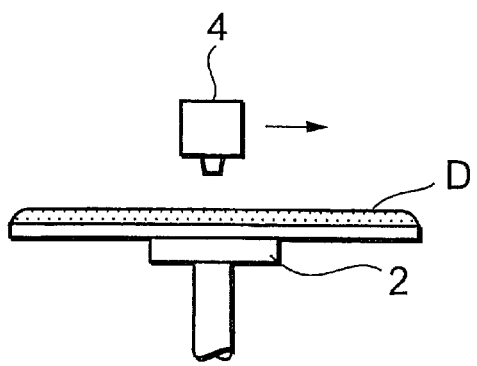

Subsequently, as shown in FIGS. 7B and 8B, the nozzle 4 is moved to the stand-by position and the bottom plate 63 of the current member 6 is positioned at the second position, and the open/close valve 36 is closed and then developing is performed with the rotation of the wafer W stopped, for example, for 60 seconds. In this state, the open/close valve 36 is closed, whereby the atmosphere in the processing case 20 flows out of only the exhaust passage 23. Further, since the bottom plate 63 of the current member 6 is placed at the second position, the air from the filter unit F can not pass through the current member 6 as described above and thus passes downward at the side of the current member 6. Thereby, air currents blow downward outside the cup 3 in the processing case 20.

Figure 8C:
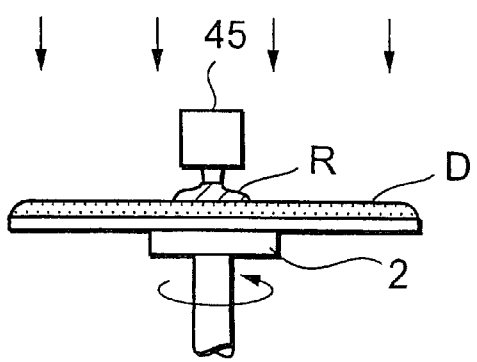
Figure 8D:
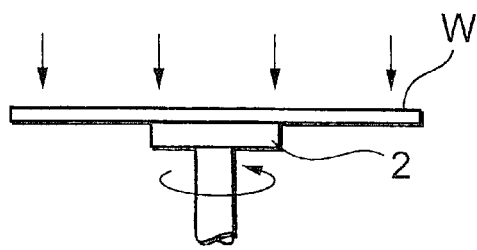
Figure 9:
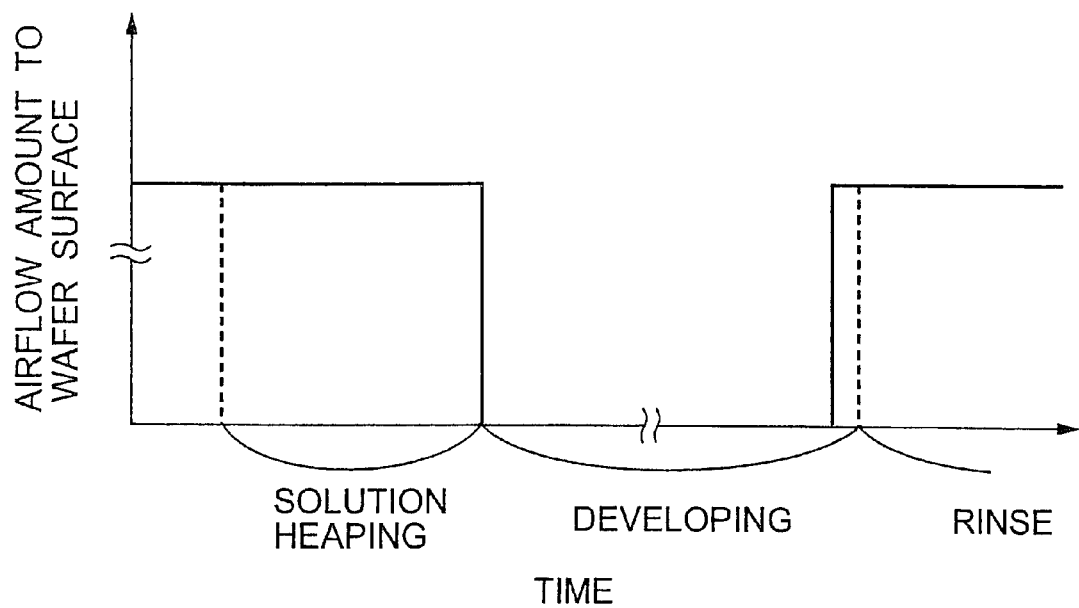
FIG. 9 is a chracterization graph showing a relation between an airflow amount to a wafer surface and time.

The developing is performed as above, and as shown in FIG. 9, just before the developing is completed, for example, one second before, the bottom plate 63 of the current member 6 is positioned at the aforesaid first position and the open/close valve 36 is opened to thereby form downflow with an airflow amount of about 0.3 m/s in the processing case 20. Then, as shown in FIG. 8C, the rinse nozzle 45 placed at the stand-by position is moved to the supply position through the upper position above the wafer holding section 2, and the rinse solution R is discharged from the rinse nozzle 45 while the wafer holding section 2 is rotated to thereby perform a rinse. Subsequently, the wafer W is rotated at a high speed to thereby dry the wafer surface with downflow with an airflow amount of about 0.3 m/s formed in the processing case 20 as shown in FIG. 8D, and thereafter the wafer holding section 2 is raised to the delivery position for the wafer W to deliver the wafer W to the transfer arm not shown.

When the wafer W is delivered to the wafer holding section 2 or when the nozzle 4 or the rinse nozzle 45 is moved to the position above the wafer, the upper end of the outer cup 31 is positioned below the delivery position for the wafer W. While the developing solution D or the rinse solution R is supplied to the wafer W, during the developing, or during the drying, the upper end of the outer cup 31 is positioned above the delivery position for the wafer W to perform predetermined processing.

With the above-described developing method, air streams of downflow in the processing case 20 are obstructed by the current member 6 above the wafer during the developing to prevent air currents from blowing to the wafer surface, whereby it is difficult for the temperature distribution in the developing solution D on the wafer surface to occur and the developing processing with high uniformity can be performed.

In other words, since there is little or an extremely small amount of air currents blowing against the wafer W from above in the processing case 20 during the developing, the amount of airflow flowing outward along the wafer face is extremely small. Thus, there hardly occurs that the airflow amount in the rim area is large compared with that in the area close to the center of the wafer W, so that it is difficult for the heat of evaporation in the rim area of the wafer W to increase. Thereby, amounts of heat radiation of the developing solution D are brought into an almost uniform state within the plane of the wafer W, with the result that degrees of temperature fall of the developing solution D on the wafer W are made almost uniform within the plane.

Therefore, since the developing is performed in a state where the temperatures in the developing solution D are almost uniform within the plane of the wafer, occurrence of developing unevenness because of temperature difference is suppressed, whereby variations in measurements of developed line width are suppressed, so that uniformity of the developing processing is improved. When the developing processing was actually performed for the wafer W to which an ion beam resist was applied and exposed in a predetermined pattern form by the aforesaid developing apparatus, there was little irregularities in developed line width between the area close to the center of the wafer W and the rim portion, and it has been shown that uniform developing processing can be performed.

Further, in the aforesaid embodiment, downflow is formed outside the cup 3 also during the developing, thereby bringing the inside of the processing case 20 to a positive pressure and preventing particles from a drive system from suspending. Furthermore, in the aforesaid embodiment, downflow is formed in the processing case 20 just before the developing is completed in order to prevent mist from scattering outside the cup due to the rinse processing.

In the present invention in the above description, it is also suitable to improve the uniformity of the developing processing by adjusting an area of the wafer W against which air currents blow during the developing. In other words, it is suitable to make the airflow amount to the area close to the center of the wafer W larger than that to the rim area, for example, during the developing. Alternatively, it is also suitable that air currents blow against only the area close to the center of the wafer W and not against the rim area during the developing.

At this time, the airflow amount to the wafer W can be adjusted by the sizes of the air holes 62a (63a) of the current member if other conditions are the same, and the airflow amount increases the larger air hole 62a (63a) becomes in size. Accordingly, the airflow amount to the area close to the center of the wafer W is larger than that to the rim area if the air holes 62a of the top plate 62 are obstructed in the vertical direction by a portion of the bottom plate 63 in which the air holes 63a are not formed so that the air holes 62a of the top plate 62 at positions corresponding to the area close to the center of the wafer W are larger in size than the air holes 62a of the top plate 62 at positions corresponding to the rim area of the wafer W when the bottom plate 63 is slid to the second position.

Further, air currents blow against only the area close to the center of the wafer W if the air holes 62a of the top plate 62 are obstructed in the vertical direction by the portion of the bottom plate 63 in which the air holes 63a are not formed so as to bring about a state where the air holes 62a of the top plate 62 at positions corresponding to the area close to the center of the wafer W are opened and the air holes 62a at positions corresponding to the rim area of the wafer W are closed when the bottom plate 63 is slid to the second position.

As described above, even if the airflow amount to the area close to the center of the wafer W is made larger than that to the outer periphery portion during the developing or air currents are allowed to blow against only the area close to the center of the wafer W during the developing, the air currents have blown against the wafer W from above flow outward on the wafer W. Thus, the airflow amount on the rim area of the wafer W increases, whereby the airflow amounts are made almost uniform within the plane of the wafer W, so that occurrence of temperature distribution of the developing solution within the wafer plane is prevented and the developing processing with high uniformity can be performed.

In the aforesaid embodiment, to prevent the formation of turbulent flow, it is preferable to adjust the airflow amount from the filter unit F so that the amount of air jetted downward from the filter unit F matches with the airflow amount of air exhausted from the ejection passage 35 and the exhaust passage 23 except during the rest developing (see FIG. 7A), and to adjust the airflow amount from the filter unit F so that the amount of air jetted downward from the filter unit F matches with the airflow amount of air exhausted from the exhaust passage 23 during the rest developing (see FIG. 7B). However, it is preferable to adjust the airflow amount from the filter unit F to be increased more than usual just before entrance into the rest developing, that is, just before the ejection passage 35 is closed.

Figure 12:
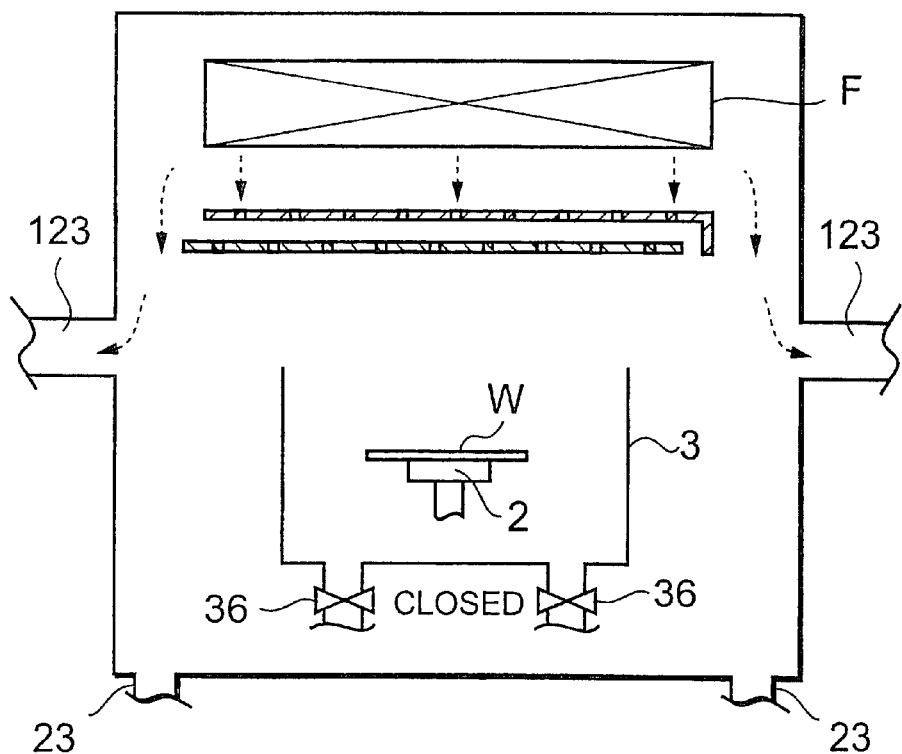
FIG. 12 is a sectional view showing a developing apparatus according to another embodiment of the present invention.

Further, in the aforesaid embodiment, as shown in FIG. 7B, the open/close valve 36 is closed during the rest developing so that the atmosphere in the processing case 20 flows out of only the exhaust passage 23. However, as shown in FIG. 12, an exhaust passage 123 may be additionally provided at the side of the processing case 20 and the open/close valve 36 and the exhaust passage 23 are closed during the rest developing so that the atmosphere flows out of only the exhaust passage 123. Through the above configuration, it is possible to prevent the atmosphere of downflow from blowing directly against the wafer W during the rest developing with more reliability.

Further, as shown in FIG. 1, it is more preferable to provide an exhaust hole 120 for allowing air flowing sideward by the current member 6 to escape outside the processing case 20 at the upper portion of the side portion of the processing case 20 above the top plate 62 of the current member 6. Thereby, the occurrence of turbulent flow in the processing case 20 due to the air flowing into the side by the current member 6 can be prevented. Moreover, the exhaust hole 120 is connected to the delivery passage 52, thereby efficiently utilizing the clean air.

Figure 10:
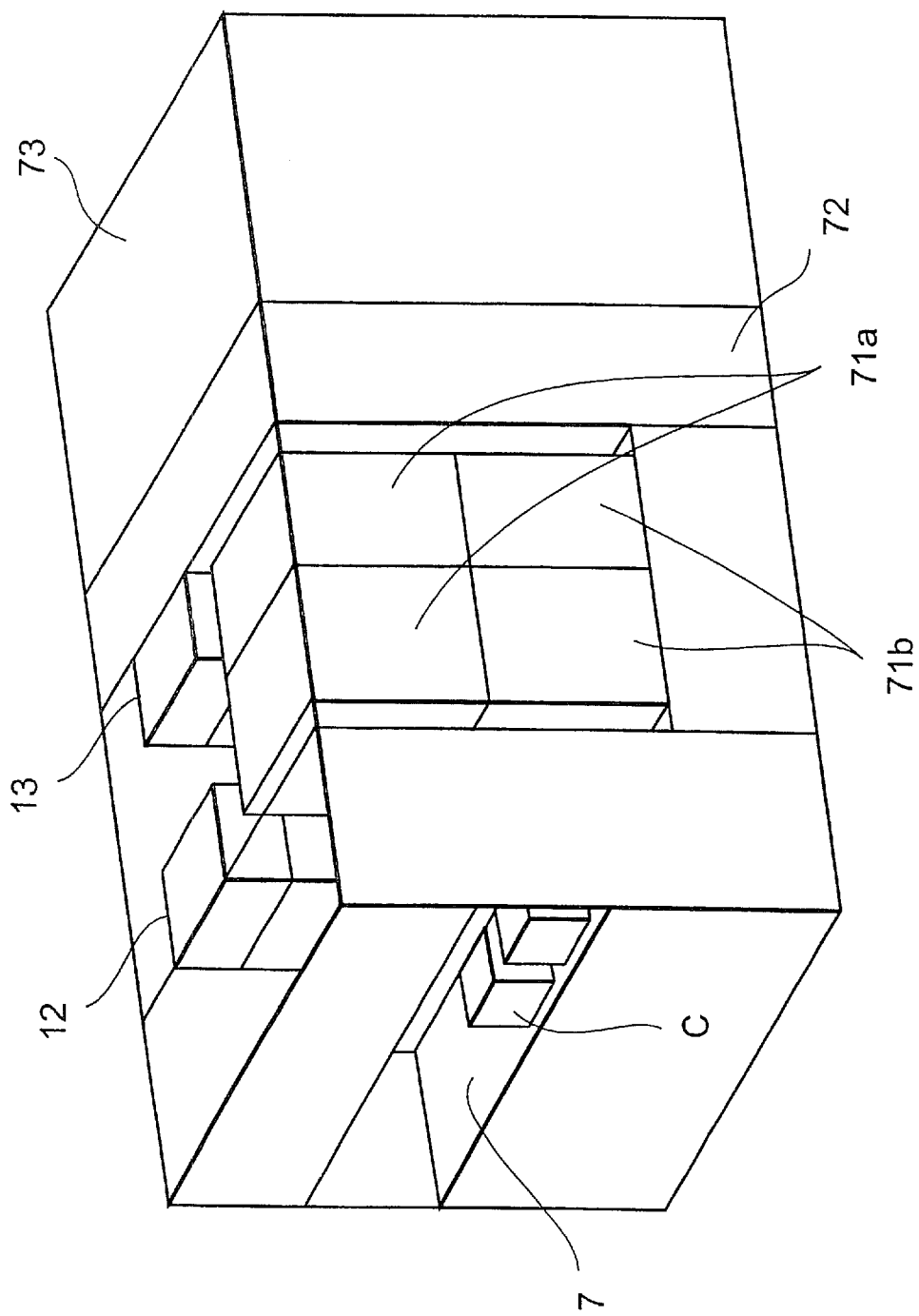
FIG. 10 is a perspective view showing an example of a coating and developing apparatus in which the aforesaid developing apparatus is installed.
Figure 11:
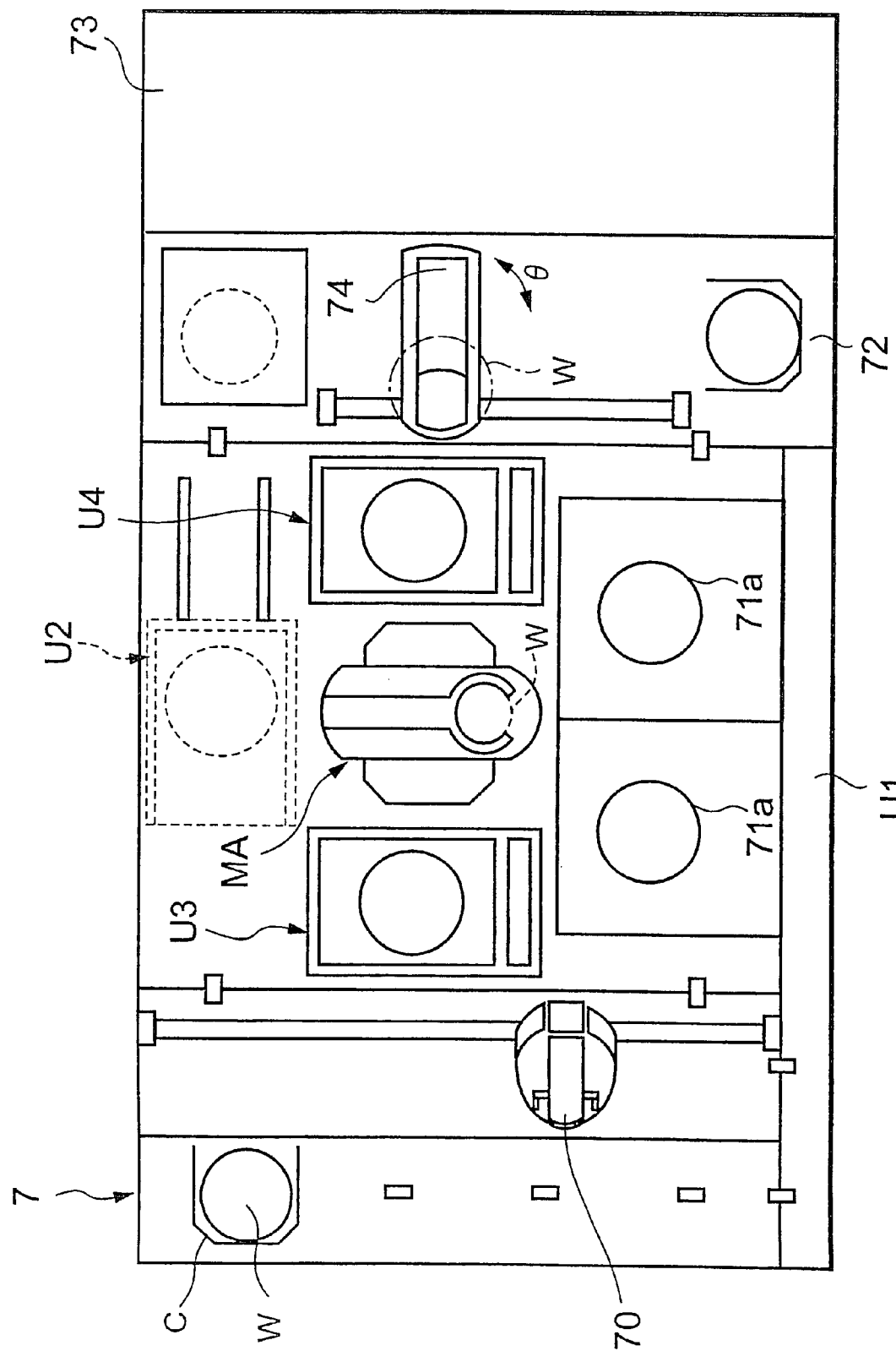
FIG. 11 is a plan view showing the example of the coating and developing apparatus in which the aforesaid developing apparatus is installed.

Next, an outline of an example of a coating and developing apparatus in which the developing apparatus used for carrying out the developing method according to the present invention is installed in a unit will be explained with reference to FIG. 10 and FIG. 11. In FIG. 10 and FIG. 11, numeral 7 is a carrying in/out stage for carrying in/out a wafer cassette and a cassette C in which, for example, 25 wafers W are housed is mounted thereon by, for example, an automatic transfer robot. A delivery arm 70 for the wafer W is provided to be movable in an X-direction and a Y-direction and rotatable in a θ-direction (rotation around a vertical axis) in an area facing the carrying in/out stage 7. Moreover, on the back side of the delivery arm 70, a coating and developing system unit U1 is arranged, for example, on the right side, for example, seeing from the carrying in/out stage 7 to the back side, and heating and cooling system units U2, U3, and U4 are arranged on the left side, the front side, and the back side respectively. Further, a wafer transfer arm MA, which is, for example, ascendable and descendable, movable laterally and longitudinally, and rotatable around a vertical axis, for delivering the wafer W between the coating and developing system unit and the heating and cooling system units is provided. However, the unit U2 and the wafer transfer arm MA are not shown in FIG. 10 for convenience.

In the coating and developing system unit, for example, two developing units 71a are provided at the upper tier, and two coating units 71b are provided at the lower tier. In the heating and cooling system unit, a heating unit, a cooling unit, a hydrophobic processing unit, and the like are vertically arranged. If the aforesaid section including the described-above coating and developing system unit and the heating and cooling system units is called a clean track, an aligner 73 is connected to the back side of the clean track with an interface unit 72 therebetween. The interface unit 72 performs delivery of the wafer W between the clean track and the aligner 73 by a wafer transfer arm 74 which is configured to be, for example, ascendable and descendable, movable laterally and longitudinally, and rotatable around a vertical axis.

Explaining the flow of the wafer in this apparatus, first a wafer cassette C in which wafers W are housed is carried into the carrying in/out stage 7 from the outside, and the wafer W is taken out of the cassette C by the wafer transfer arm 70 and delivered to the wafer transfer arm MA via a delivery table that is one of shelves in the aforesaid heating and cooling unit U3. Then, the wafer w is subjected to hydrophobic processing in a processing section at one shelf in the unit U3 and thereafter coated with a resist solution in the coating unit 72, whereby a resist film is formed. The wafer W coated with the resist film is heated in the heating unit, then transferred to the aligner 73 via the interface unit 72, and exposure is performed through a mask corresponding to a pattern in the aligner 73.

Thereafter, the wafer W is heated in the heating unit and then cooled in the cooling unit. Subsequently, the wafer W is transferred to the developing unit 71a to be subjected to developing processing, whereby a resist mask is formed. Thereafter, the wafer W is returned to the cassette C on the carrying in/out stage 7.

In the above, a substrate is not limited to a wafer, but a glass substrate for a liquid crystal display is suitable in the present invention. Further, it is also suitable to structure the top plate 62 and the bottom plate 63 of the current member 6 to be slid relative to each other in a lateral direction, and any of them may be moved.

Furthermore, the current member 6 is not limited to the aforesaid configuration in shape, attachment position, or the like if it obstructs air streams to the wafer surface during the developing.

Figure 13:
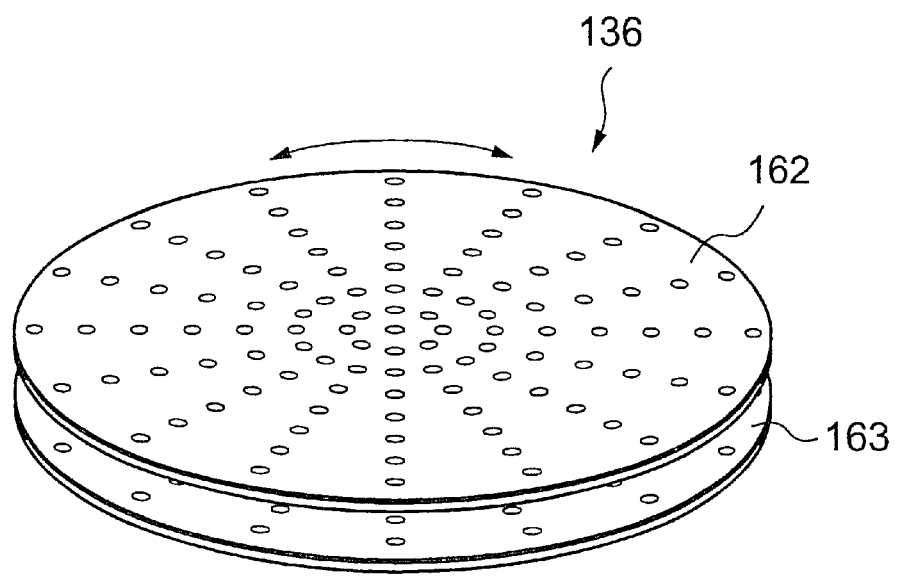
FIG. 13 is a perspective view showing first embodiment of a current member.

For example, as shown in FIG. 13, it is suitable to structure a top plate 162 and a bottom plate 163 of a current member 136 to be rotated relative to each other.

Figure 14:
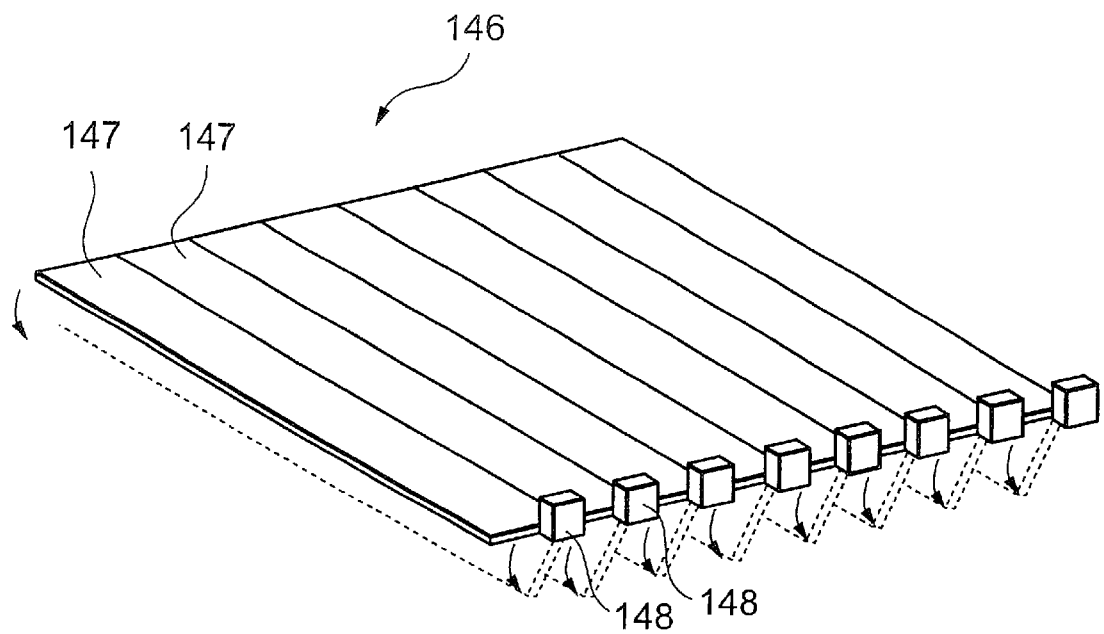
FIG. 14 is a perspective view showing second embodiment of a current member.
Figure 15:
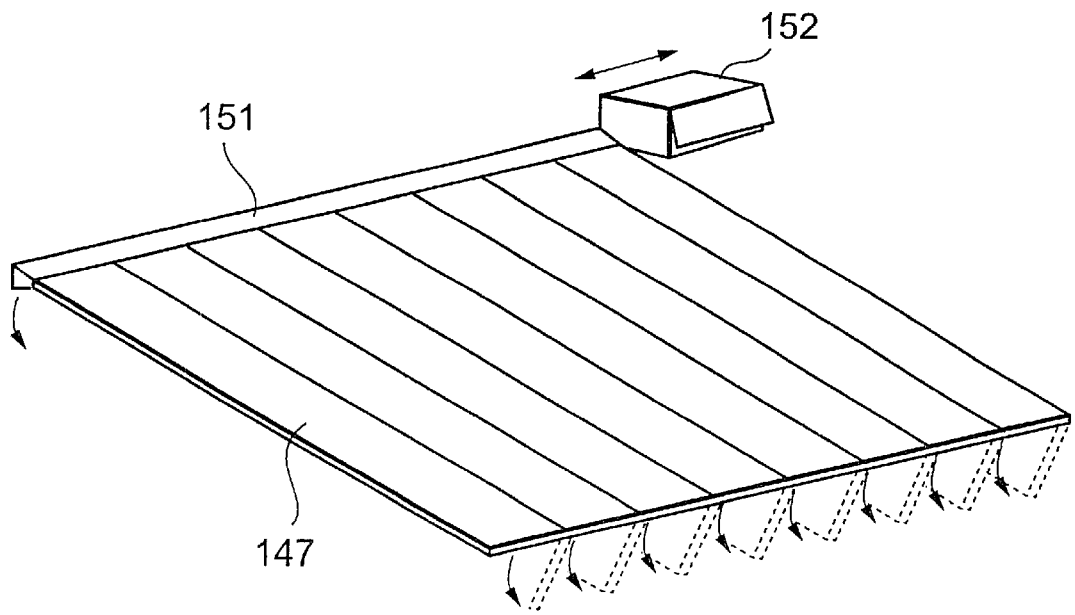
FIG. 15 is a perspective view showing third embodiment of a current member.

Moreover, as shown in FIG. 14, it is also suitable to place many oblong plate-shaped members 147 side by side to form a rectangle as a current member 146 and to rotate each of the plate-shaped members 147 by means of individual rotation drive mechanism 148 respectively to adjust an obstruction amount of air. The provision of the respective individual rotation drive mechanism 148 makes it possible to change the obstruction amount of air in accordance with the area on the current member 146. As shown in FIG. 15, the plate-shaped members 147 may be joined with each other by a joint member 151 connected to a drive mechanism 152 to drive the plate-shape members 147 by one drive mechanism 152. Thereby, the number of components of the drive mechanism can be reduced.

Figure 16:
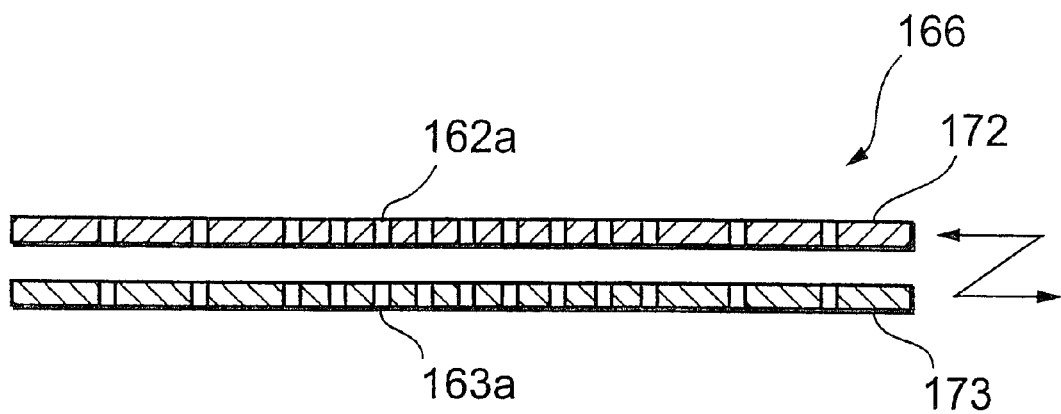
FIG. 16 is a side view showing fourth embodiment of a current member.

As shown in FIG. 16, for example, by changing densities of first air holes 162a provided in a top plate 172 of a current member 166 and second air holes 163a provided in a bottom plate 173 in accordance with the area on the current member 166, the obstruction amount of air can be changed in accordance with the area. In FIG. 16, the densities of the first air holes 162a and the second air holes 163a are increased at the central portion of the current member 166, whereby the airflow amount of air currents blowing against the area close to the center of the substrate surface can be made larger than that against the rim area.

Figure 17:
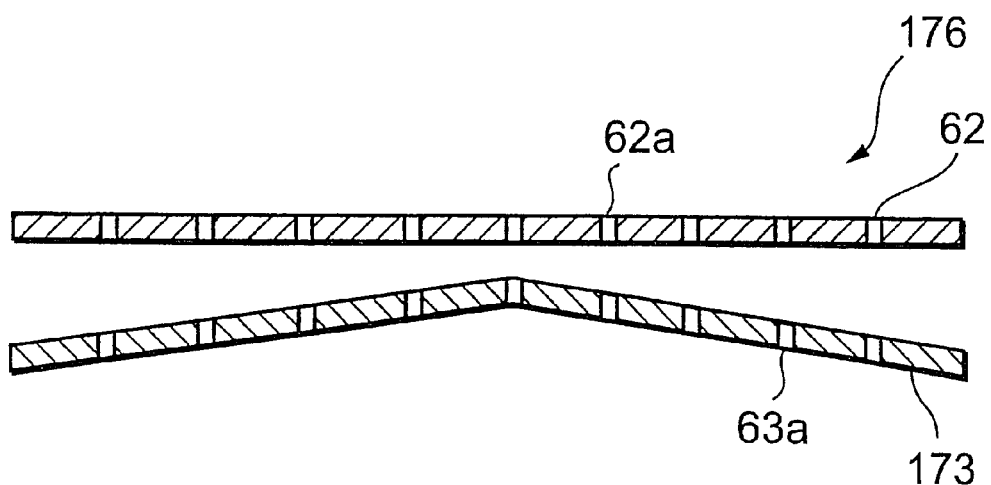
FIG. 17 is a side view showing fifth embodiment of a current member.
Figure 18:
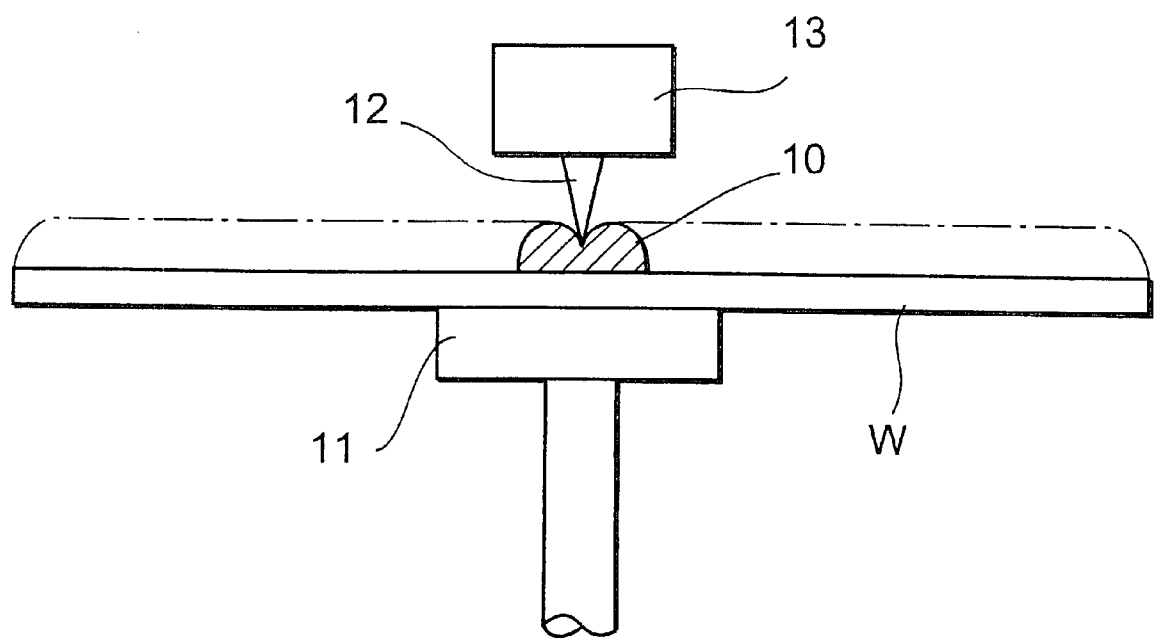
FIG. 18 is a sectional view for explaining a conventional developing method.
Figure 19:
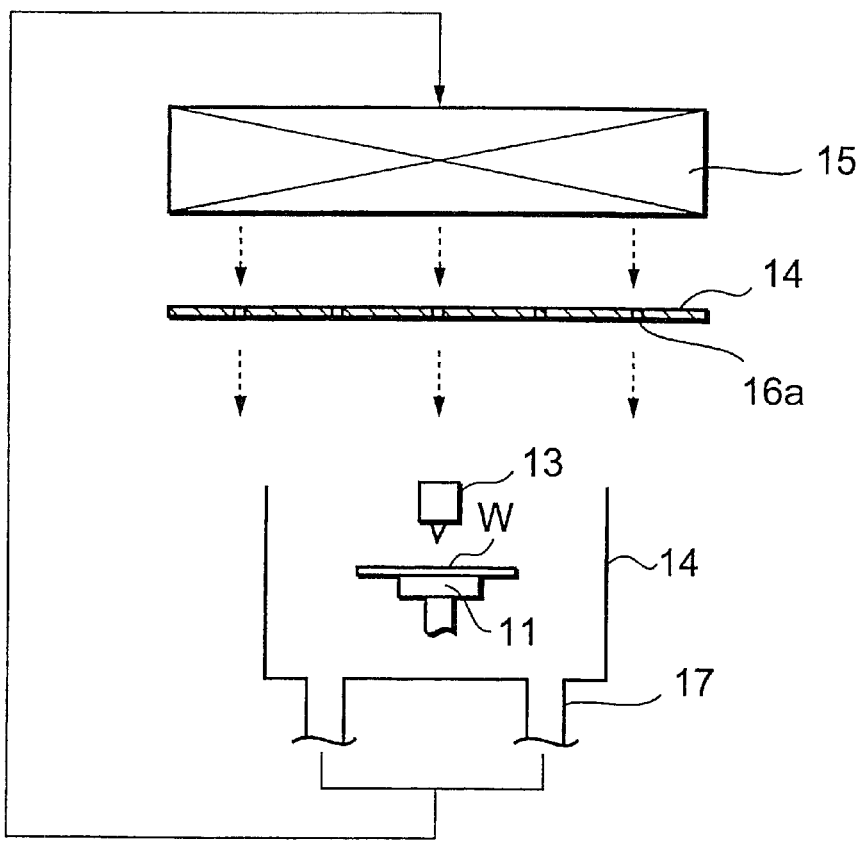
FIG. 19 is a sectional view showing a conventional developing apparatus.
Figure 20:
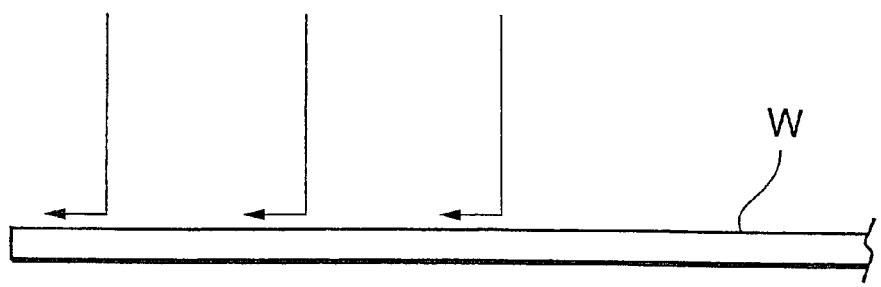
FIG. 20 is a sectional view for explaining flows of air currents on a wafer face in the conventional developing apparatus.

Further, as shown in FIG. 17, the bottom plate 173 of a current member 176 is made to fold at the middle, whereby the airflow amount of air currents blowing against the area close to the center of the substrate surface can be made larger than that against the rim area.

In the present invention, the developing may be performed while the wafer W is rotated at a low speed, for example, a rotation speed of about 10 rpm. Further, the nozzle for supplying the developing solution to the wafer W is not limited to those in the above-described examples, but also a type of nozzle of supplying the developing solution to the area close to the center of the wafer W and then the wafer W is rotated to thereby extend the developing solution over the entire wafer surface by centrifugal force of the rotation is also applicable.

As has been described, according to the present invention, degrees of temperature variation of a processing solution within a surface of a substrate are made uniform and thus uniformity in temperature of the processing solution within the plane of the substrate is enhanced, whereby occurrence of processing unevenness because of temperature difference in the processing solution is suppressed, so that processing with high uniformity can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A developing apparatus for heaping a developing solution to a front face of a substrate to perform developing in an atmosphere in which an air stream toward the front face of the substrate is formed, comprising:

a substrate holding section for holding the substrate;

a supply section for supplying the developing solution to the substrate;

a first current plate provided on the front face side of the substrate held by the substrate holding section to oppose the substrate and in which first air holes are formed;

a second current plate provided to oppose the first current plate to move in a plane direction relative to the first current plate and in which second air holes are formed; and airflow amount adjustment means for moving the first current plate and the second current plate relative to each other in the plane direction to overlap the first air holes and an area of the second current plate where the second air holes are not formed in a direction orthogonal to the plane direction to thereby adjust sizes of the first air holes and control an airflow amount of an air current blowing against the front face of the substrate.

2. The apparatus as set forth in claim 1, wherein said airflow amount adjustment means makes the sizes of the first air holes smaller while the developing of the front face of the substrate is performed with the developing solution remaining heaped on the substrate than while the developing solution is heaped on the front face of the substrate to make an airflow amount of an air current blowing against the front face of the substrate smaller during the developing than during the heaping of the developing solution.

3. The apparatus as set forth in claim 2, wherein said airflow amount adjustment means makes the sizes of the first air holes larger in an area close to the center of the substrate than in a rim area to make an airflow amount of an air current blowing against the area close to the center of the front face of the substrate larger than that against the rim area while the developing of the front face of the substrate is performed.

4. The apparatus as set forth in claim 1, wherein said airflow amount adjustment means slides said first current plate and said second current plate relative to each other in one direction to thereby move said first current plate and said second current plate relative to each other in the plane direction.

5. The apparatus as set forth in claim 1, wherein said airflow amount adjustment means rotates said first current plate and said second current plate relative to each other to thereby move said first current plate and said second current plate relative to each other in the plane direction.

6. An apparatus for supplying a developing solution to a first face of a substrate having the first face and a second face, comprising:

a processing case;

a cup disposed inside the processing case, that surrounds the substrate, and has an opening at an upper portion thereof;

a substrate holding section that holds the substrate, the first face facing upward;

a developing solution supply section that supplies the developing solution to the first face of the substrate held in the substrate holding section, the developing solution retained on the first face of the substrate for a predetermined period of time in order to ensure that the developing solution is sufficiently in contact with the first face of the substrate, after the developing solution is supplied to the first face of the substrate;

a gas supply section disposed at an upper portion of the processing case for supplying gas downward inside the processing case;

a first current plate disposed between the substrate holding section and the gas supply section and facing the substrate on the substrate holding section, a plurality of first air holes formed on the first current plate; and a second current plate facing and relatively movable along the first current plate, a plurality of second air holes formed on the second current plate to correspond to the first air holes, wherein an obstruction amount of gas supplied from the gas supply section toward the substrate is controlled by moving at least one of the first and second current plates to change a relative position between the first and second air holes.

7. The apparatus as set forth in claim 6, wherein said control section comprises:

a plurality of rotatable plate-shaped members placed to form a rectangle; and a rotation drive section for rotating each of the plate-shaped members.

8. The apparatus as set forth in claim 7, wherein the rotation drive section comprises a plurality of rotation drive mechanisms provided for each of the plate-shaped members.

9. The apparatus as set forth in claim 7, wherein the rotation drive section comprises:

a joint member for joining each of the plate-shaped members; and a rotation drive mechanism for collectively rotating each of the plate-shaped members via the joint member.

10. A developing apparatus for supplying a developing solution to a first face of a substrate having the first face and a second face, comprising:

a processing case;

a cup disposed inside the processing case that surrounds the substrate, and having an opening at an upper portion thereof;

a substrate holding section that holds the substrate, the first face facing upward;

a developing solution supply section that supplies the developing solution to the first face of the substrate held in the substrate holding section, the developing solution being retained on the first face of the substrate for a predetermined period of time in order to ensure that the developing solution is sufficiently in contact with the first face of the substrate, after the developing solution is supplied to the first face of the substrate;

a gas supply section disposed at an upper portion of the processing case that supplies gas downward inside the processing case;

a control section, disposed between the substrate holding section and the gas supply section, that controls an obstruction amount of gas supplied from the gas supply section, the control section increases the obstruction amount of the gas while the developing solution is retained on the first face;

a first gas exhaust section, disposed at a lower portion of the processing case, that exhausts gas from the processing case;

a second gas exhaust section disposed at a lower portion of the cup that exhausts gas from the cup;

a gas exhaust stopper that stops exhaust by said second gas exhaust section during the rest state;

wherein the predetermined solution is a developing solution necessary to be in a rest state after being supplied to the first face of the substrate;

means for stopping exhaust by said second gas exhaust section during the rest state.

11. A method of developing a front face of a substrate with a developing solution for photolithography process, comprising the step of:

heaping a developing solution to the front face of the substrate in an atmosphere in which an air stream toward the front face of the substrate is formed; and developing the front face of the substrate with the developing solution remaining heaped on the substrate while an area of the front face of the substrate against which an air current blows is adjusted;

wherein, in said step of developing the front face of the substrate, an airflow amount of an air current blowing against the front face of the substrate is larger in an area close to the center of the substrate than in a rim area thereof.

12. A developing apparatus for supplying a developing solution for photolithography process to a first face of a substrate having the first face and a second face, comprising:

a processing case;

a cup disposed inside the processing case, that surrounds the substrate, and having an opening at an upper portion thereof;

a substrate holding section that holds the substrate, the first face facing upward;

a developing solution supply section that supplies the developing solution to the first face of the substrate held in the substrate holding section, the developing solution being retained on the first face of the substrate for a predetermined period of time in order to ensure that the developing solution is sufficiently in contact with the first face of the substrate, after the developing solution is supplied to the first face of the substrate;

a gas supply section disposed at an upper portion of the processing case that supplies gas downward inside the processing case;

a control section disposed between the substrate holding section and the gas supply section, for controlling an obstruction amount of gas supplied from the gas supply section, the control section increases the obstruction amount of the gas while the developing solution is retained on the first face;

a first gas exhaust section disposed at a lower portion of the processing case, that exhausts gas from the processing case;

a second gas exhaust section disposed at a lower portion of the cup that exhausts gas from the cup; and a third gas exhaust section disposed near the processing case that exhausts gas supplied from the gas supply section, and from the processing case while the developing solution is retained on the front face.

13. A developing apparatus for supplying a developing solution for photolithography process to a first face of a substrate having the first face and a second face, comprising:

a processing case;

a cup disposed inside the processing case, that surrounds the substrate, and has an opening at an upper portion thereof;

a substrate holding section that holds the substrate, the first face facing upward;

a developing solution supply section that supplies the developing solution to the first face of the held substrate held in the substrate holding section, the developing solution being retained on the first face of the substrate for a predetermined period of time in order to ensure that the developing solution is sufficiently in contact with the first face of the substrate, after the developing solution is supplied to the first face of the substrate;

a gas supply section disposed at an upper portion of the processing case that supplies gas downward in the processing case;

a plurality of rectangular plates disposed between the substrate holding section and the gas supply section substantially in a horizontal position, and having long sides arranged side by side, in order to prevent air supplied from the air supply section to directly reach the substrate holding section; and a rotation drive section that rotates the rectangular plates around a horizontal axis and tilts the rectangular plates to allow a downward airflow from the gas supply section to pass through.

14. The apparatus as set forth in claim 13, wherein the rotation drive section comprises a plurality of rotation drive mechanisms provided for each of the rectangular plates.

15. The apparatus as set forth in claim 13, wherein the rotation drive section comprises:

a joint member that joins each of the rectangular plates; and a rotation drive mechanism that collectively rotates each of the rectangular plates via the joint member.

* * * * *